(12) United States Patent
Pornin et al.

(10) Patent No.: US 8,772,883 B2
(45) Date of Patent: Jul. 8, 2014

(54) SEALED CAVITY AND METHOD FOR PRODUCING SUCH A SEALED CAVITY

(75) Inventors: Jean-Louis Pornin, Crolles (FR); Fabrice Jacquet, Saint Pierre de Mesage (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 232 days.

(21) Appl. No.: 13/381,241

(22) PCT Filed: Jul. 6, 2010

(86) PCT No.: PCT/EP2010/059640
§ 371 (c)(1),
(2), (4) Date: Dec. 28, 2011

(87) PCT Pub. No.: WO2011/003908
PCT Pub. Date: Jan. 13, 2011

(65) Prior Publication Data
US 2012/0112293 A1    May 10, 2012

(30) Foreign Application Priority Data
Jul. 7, 2009  (FR) ..................................... 09 54684

(51) Int. Cl.
*H01L 29/84*  (2006.01)

(52) U.S. Cl.
USPC .................... 257/415; 257/E31.001; 438/415

(58) Field of Classification Search
USPC ............................. 257/415, E31.001; 438/50
See application file for complete search history.

(56) References Cited

U.S. PATENT DOCUMENTS 7,364,932 B2 * 4/2008 Ikushima et al. ............... 438/53

8,159,056 B1 * 4/2012 Kim et al. ..................... 257/678
2003/0155643 A1 * 8/2003 Freidhoff ...................... 257/704
2003/0183916 A1 10/2003 Heck et al.
2006/0267109 A1 11/2006 Ohguro
2008/0049386 A1 2/2008 Pornin et al.
2008/0079142 A1 4/2008 Carmona et al.
2011/0189844 A1 8/2011 Pornin et al.

FOREIGN PATENT DOCUMENTS

FR    2 903 678          1/2008
WO   WO 2006/081636 A1   8/2006

OTHER PUBLICATIONS

U.S. Appl. No. 13/977,897, filed Jul. 1, 2013, Jacquet, et al.
U.S. Appl. No. 13/644,444, filed Oct. 4, 2012, Pornin et al.
U.S. Appl. No. 13/645,717, filed Oct. 5, 2012, Baillin et al.
French Preliminary Search Report issued Apr. 14, 2010, in Patent Application No. 0954684.

\* cited by examiner

*Primary Examiner* — Matthew Reames
(74) *Attorney, Agent, or Firm* — Oblon, Spivak, McClelland, Maier & Neustadt, L.L.P.

(57) ABSTRACT

A method for producing a sealed cavity, including: a) producing a sacrificial layer on a substrate; b) producing a cover layer covering at least the sacrificial layer and a portion of the face of the substrate not covered by the sacrificial layer, the cover layer including lateral flanks forming, with the substrate, an angle of less than 90°; c) producing a hole through one of the lateral flanks of the cover layer such that a maximum distance between the substrate and an edge of the hole is less than approximately 3 μm, the hole crossing a portion of the cover layer deposited on a portion of the substrate not covered by the sacrificial layer; d) eliminating the sacrificial layer through the hole, forming the cavity; and e) depositing at least one material plugging the hole in a sealed fashion.

19 Claims, 5 Drawing Sheets

SEALED CAVITY AND METHOD FOR PRODUCING SUCH A SEALED CAVITY

TECHNICAL FIELD

The invention concerns the production of a cavity which is sealed against fluids and/or gases, used for example for an encapsulation of a microelectronic device, and more specifically an encapsulation under vacuum in thin layers of devices of the MEMS type (micro-electro-mechanical system) or MEOMS type (micro-electro-optico system), or again of the NEMS type (nano-electro-mechanical system). In the remainder of this document the term "MEMS" will be used to designate a device of the MEMS, NEMS or MEOMS type.

The invention also applies for the production of a cavity forming a channel for circulation of liquid or gaseous fluids.

STATE OF THE PRIOR ART

The technique of encapsulation ("packaging") in thin layers, also called PCM, is perfectly suited for producing an encapsulation of microelectronic devices of the MEMS type, for example sensors, operating at atmospheric pressure. When this type of encapsulation is implemented the MEMS device is covered with a sacrificial layer, and this sacrificial layer is then covered with a thin layer of a thickness of between approximately 1 μm and 5 μm, intended to form a cover. Release holes are then made through the top of the cover, thus forming entrance-ways to etch the sacrificial layer.

By this means a cavity is obtained in which the MEMS device is encapsulated. The release holes are then plugged by a deposit of polymer which plugs the holes without passing through the holes.

Increasing numbers of MEMS devices, for example accelerometers, gyroscopes or optical detectors, operate under low pressure or under vacuum, i.e. at pressures of between approximately 900 mbar and $1.10^{-3}$ mbar.

In this case, plugging of the release holes by a polymer deposit is incompatible with the production of a low-pressure cavity or cavity under vacuum.

It is known to use methods of encapsulation under vacuum in which the release holes are plugged by fusion of an alloy on a wettable surface around the release holes, forming beads composed of this alloy above these release holes. However, this method requires the use of several technological steps. In addition, the remelting of the alloy under vacuum requires a preparation of this alloy which is complex to implement if it is desired to prevent the presence of aggressive residual gases in the cavity, or gases which are incompatible with the desired pressure.

If it is desired to plug the release holes by a deposit under vacuum or under low pressure of a plugging layer composed of a suitable material such as a dielectric or a metal, material originating from this deposit can cross the holes and be deposited on the active portion, i.e. on the MEMS device, which could disrupt or prevent operation of the MEMS device.

To resolve this problem document WO 2006/081636 A1 describes a method of encapsulation in which the cover is formed by a porous layer, where the pores form very fine release holes (hole diameters less than approximately 500 nm) with a high depth/diameter ratio.

This method enables material from a plugging layer formed above the cover from being deposited on the MEMS device.

It is also known to move the release holes from their positions to outside the cavity. In this case the height of the holes to be plugged is substantial, since it is equal to the height of the cavity.

It is also known to define narrow release channels on the sides of the main cavity. In this case, when the height to be plugged is small, the release speed is then greatly reduced.

It is also known to produce the release holes in the form of baffles through the production of a cover with double walls, as is for example described in document US 2008/0079142 A1.

However, these methods have the disadvantages that they require substantial space, that they make the encapsulation method more complex, and therefore more expensive, and/or that they greatly limit the plugging speed and the possibilities for release of the sacrificial layer.

ACCOUNT OF THE INVENTION

One aim of the present invention is to propose a method of production of a sealed, or hermetic, cavity, with regard to at least one fluid and/or one gas, which can be used to produce, for example, an encapsulation of a microelectronic device, for example of the MEMS type, which is compatible to form a sealed cavity under low pressure or under vacuum, and which does not have the disadvantages of the previously described encapsulation methods of the prior art.

A method of production of at least one sealed, or hermetic, cavity is proposed, including at least the following steps:

a) production of a sacrificial layer on a portion of one face of a substrate, b) production of a cover layer covering at least the sacrificial layer and including lateral flanks forming, with the portion of the face of the substrate covered by the sacrificial layer, at least an angle of less than 90°, c) production of at least one hole through at least one of the lateral flanks of the cover layer such that a maximum distance, along an axis perpendicular to the said face of the substrate, between the said face of the substrate and at least one edge of the hole on the side of one face of the cover layer positioned against the sacrificial layer, is less than approximately 3 μm, d) elimination of the sacrificial layer through the hole, where the space released by this elimination forms the cavity, e) deposit of at least one material plugging the hole in a sealed fashion.

The term "substrate" is used here in the broad sense, and can designate a single layer or a stack of several layers, whether or not structured, for example in the case of an SOI (Semiconductor On Insulator) substrate, in which the upper layer of silicon would include the face on which the sacrificial layer is produced.

This method enables one or more release holes to be produced by using only a single level of photolithography, unlike the release holes produced in the form of baffles in a cover with double walls, or cover with channels which have been moved out of position.

In addition, by choosing the height of the release hole or holes, i.e. the distance, along an axis perpendicular to the face of the substrate, between the said face of the substrate and the highest point of the hole or holes located on the side of the face of the cover layer positioned against the sacrificial layer, corresponding to the maximum distance, along an axis perpendicular to the said face of the substrate, between the said face of the substrate and at least one edge of the hole or holes located on the side of one face of the layer, which is positioned against the sacrificial layer, it is possible to choose the desired release speed, i.e. the speed at which the sacrificial layer is eliminated, depending on the technique of plugging of the release hole or holes which is used. The desired height can be obtained, for example, by choosing the angle formed by the lateral flanks, or lateral walls, of the cover layer, the position of the release hole or holes on the lateral flanks of the cover layer, or again the dimensions and/or the shape of the release hole or holes. Thus, it is possible to eliminate the sacrificial layer rapidly by producing one or more holes having sizeable flow areas and/or by producing a large number of holes.

This method also provides a freedom of positioning of the release hole or holes without this subsequently being prejudicial when the hole or holes are plugged.

In addition, unlike the methods of the prior art using channels which are moved out of position relative to the cavity to form entrance-ways to a sacrificial layer, this method allows an effective solid angle for passage of the gases which increases when the elimination of the sacrificial layer starts.

This method is perfectly compatible with the perspective of an encapsulation in the wafer (a wafer including several microelectronic devices) allowing implementation of a collective encapsulation of the devices and a low semiconductor surface consumption of the wafer.

Step c) of production of the hole may be a step of production of at least one hole through the lateral flanks of the cover layer, where an upper or uppermost portion of the cover layer covers the sacrificial layer which may be kept without holes.

The value of the angle formed by the lateral flanks of the cover layer with the portion of the face of the substrate covered by the sacrificial layer may be between approximately 5° and 30°.

In a variant, the thickness of the sacrificial layer may be between approximately 0.5 µm and 1 µm and the value of the angle formed by the lateral flanks of the cover layer with the portion of the face of the substrate covered by the sacrificial layer may be between approximately 45° and 90°.

The maximum distance, along an axis perpendicular to the said face of the substrate, between the said face of the substrate and the edges of the hole may be between approximately 1 µm and 3 µm, or between approximately 1 µm and 5 µm.

Step b) of production of the cover layer may be the implementation, after step a) of production of the sacrificial layer, of a shaping, or structuring, of the sacrificial layer such that the lateral flanks of the sacrificial layer form, with the portion of the face of the substrate covered by the sacrificial layer, the angle of less than 90°, followed by a conformal deposit of the cover layer at least on the sacrificial layer.

The cover layer produced in step b) may also cover a portion of the face of the substrate which is not covered by the sacrificial layer and adjacent to the portion of the face of the substrate covered by the sacrificial layer, and the hole produced in step c) may also cross a portion of the cover layer deposited on the portion of the face of the substrate which is not covered by the sacrificial layer. Thus, it is possible to have one or more holes extending as far as the outer portion of the cavity or tangential to this outer portion (and therefore tangential to the face of the substrate), forming peripheral holes at the level of the base of the cover layer in contact with the substrate. In this configuration, when the sacrificial layer is eliminated, the release section therefore increases as this elimination of the sacrificial layer progresses, leading to a reduction of the load losses as the elimination progresses. An elimination of the sacrificial layer through one or more holes formed in this manner is therefore more rapid than an elimination through a hole leading to a channel of constant section before emerging in the cavity, since such a channel implies permanent load losses.

The hole produced in step c) may include, in a plane of the face of the cover layer positioned against the sacrificial layer, a section of dimensions less than those of a section of the hole in a plane of a second face of the cover layer opposite the said face positioned against the sacrificial layer.

Step e) of deposit of material plugging the hole in sealed fashion, or hermetically, may be implemented under low pressure or under vacuum, i.e. at pressures of between approximately $1.10^{-3}$ mbar and 900 mbar.

Step e) of deposit of material plugging the hole in sealed fashion may include the implementation of a first deposit of at least one first material partially plugging the hole, and of a second deposit of at least a second material covering the first material at least partly, and plugging the hole in sealed fashion. Thus, it is possible to use several different materials to close the cavity in sealed fashion, for example under very low pressure (for example below approximately $1.10^{-3}$ mbar).

The hole produced in step c) may include, in a plane of a face of the covering layer, a section of roughly circular or oblong shape. In the case of a section of oblong shape, the length/width ratio of the section (where the length is the dimension parallel to an axis belonging to the said plane of the face of the cover layer such that the distance between this axis and the substrate is roughly constant) may be chosen to be relatively large, i.e. greater than 1 and for example between approximately 1 and 15, so as to create slots, or flow areas, which are sufficiently large to enable the release speed, i.e. the speed of elimination of the sacrificial layer, to be optimised, without increasing the height of the release hole to be plugged relative to the substrate.

Prior to step a), a microelectronic device may be produced on or in the said portion of the face of the substrate intended to be covered by the sacrificial layer, where the said microelectronic device may be encapsulated in sealed fashion in the cavity after the implementation of step e) of deposit of material plugging the hole in sealed fashion.

The microelectronic device may be of the MEMS type.

In a variant the cavity may form a channel for circulation of liquid or gaseous fluids.

A sealed cavity is also proposed formed by at least one cover layer positioned on one face of a substrate, where the cover layer includes lateral flanks forming, with a portion of the face of the substrate positioned in the cavity, at least an angle of less than 90°, where at least one hole is produced through at least one of the lateral flanks of the cover layer such that a maximum distance, along an axis perpendicular to the said face of the substrate, between the said face of the substrate and at least one edge of the hole located on the side of a face of the cover layer forming a wall of the cavity, is less than approximately 3 µm, where at least one material plugs the hole in sealed fashion.

An uppermost portion of the cover layer may be kept without any holes.

The value of the angle formed by the lateral flanks of the cover layer with the portion of the face of the substrate positioned in the cavity may be between approximately 5° and 30°.

In a variant, a distance between the uppermost portion of the cover layer and the substrate may be between approximately 0.5 µm and 1 µm and the value of the angle formed by the lateral flanks of the cover layer with the portion of the face of the substrate positioned in the cavity may be between approximately 45° and 90°.

The cover layer may also cover at least a portion of the face of the substrate which is not positioned in the cavity and adjacent to the portion of the face of the substrate positioned in the cavity, and the hole can also cross a portion of the cover layer positioned on the portion of the face of the substrate which is not positioned in the cavity.

At least one microelectronic device may be encapsulated in sealed fashion in the cavity.

BRIEF DESCRIPTION OF THE ILLUSTRATIONS

The present invention will be better understood on reading the description of example embodiments given purely as an indication and in no way restrictively, making reference to the appended illustrations in which.

Identical, similar or equivalent portions of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED ACCOUNT OF PARTICULAR EMBODIMENTS

Reference is made to FIGS. 1 to 9, which represent steps of a method of production of a hermetic cavity 120 according to a particular embodiment. This embodiment is a method of encapsulation of a microelectronic device 100, for example of the MEMS type, such as an accelerometer, a gyroscope or an optical detector, in this cavity 120.

Figure 1:
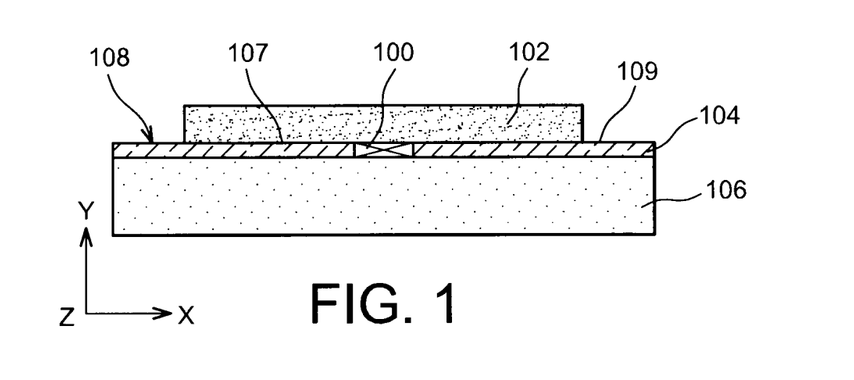
FIGS. 1 to 9 represent the steps of a method to produce a hermetic cavity, forming the subject of the present invention, according to particular embodiment.

As represented in FIG. 1, a sacrificial layer 102 is firstly produced, for example by deposit and etching, covering the device 100. In this particular embodiment, the sacrificial layer 102 is composed of a polymer and has a thickness (the dimension along the y axis represented in FIG. 1) which may be between approximately 1 μm and 10 μm. The sacrificial layer 102 covers a portion 107 of a face 108 of an active layer 104, for example composed of semiconductor, such as silicon, in which device 100 is produced, where this active layer 104 is positioned on a dielectric layer 106.

The sacrificial layer 102 is then shaped, or structured, for example by application of a thermal treatment in the form of annealing operations, with stages at different temperatures. This thermal treatment is, for example, a rise in temperature from ambient temperature to a temperature equal to approximately 300° C. Constant temperature stages lasting approximately 15 min. are, for example, implemented every 100° C. The assembly is then reduced in linear fashion to ambient temperature, without stages. This shaping may also be accomplished by stepwise etching of the sacrificial layer 102, or again, when the sacrificial layer 102 is composed of a photosensitive material, by exposure with a "grey tone phase mask" enabling exposure of the sacrificial layer 102 to be accomplished such that, when the sacrificial layer 102 is composed of a positive resin, the luminous flux reaching the sacrificial layer 102 is reduced when the distance from the edge of the sacrificial layer 102 increases.

Figure 2:
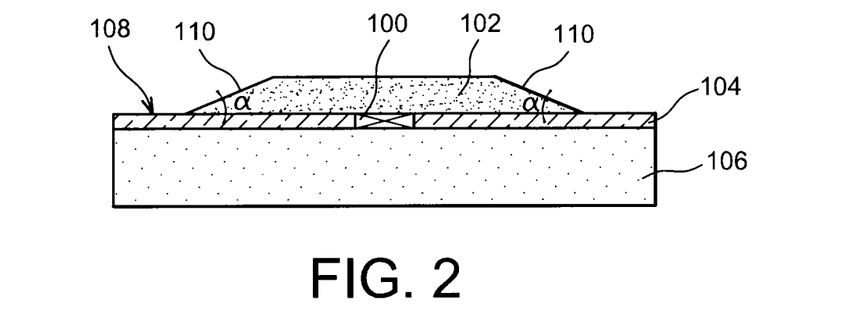

Lateral flanks 110 of this sacrificial layer 102 form, with the surface on which the sacrificial layer 102 is positioned, i.e. in this case the portion 107 of the face 108 of the active layer 104, an angle α of less than 90° (see FIG. 2).

The sacrificial layer 102 is, for example, structured such that angle α is between approximately 5° and 30°.

The volume of the sacrificial layer 102 structured in this manner is roughly equal to the volume of the cavity in which the device 100 will be encapsulated at the end of this method.

Figure 3:
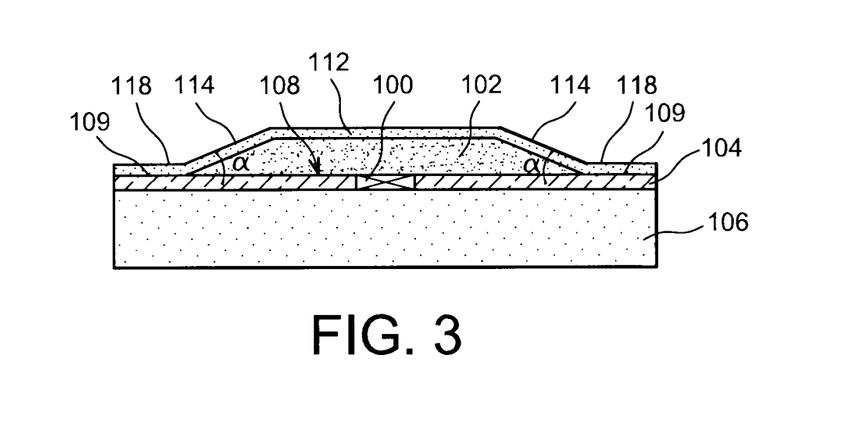

As represented in FIG. 3, a conformal deposit of a material forming a cover layer 112 intended to form the cover of the cavity in which the device 100 is intended to be encapsulated is produced.

The cover layer 112 thus covers the sacrificial layer 102 and also portions 109 of the active layer 104 not covered by the sacrificial layer 102. Thus, the cover layer 112 also includes lateral flanks 114 forming, with the portion 107 of the face 108 of the active layer 104 on which is positioned the sacrificial layer 102, an angle α of less than 90°, and for example between approximately 5° and 30°.

This cover layer 112 is composed, for example, of a dielectric material such as $SiO_2$ or SiN, but can also be composed of a semiconductor material such as silicon or again a metal.

The thickness of the cover layer 112 is, for example, between approximately 1 μm and 5 μm.

Figure 4A:
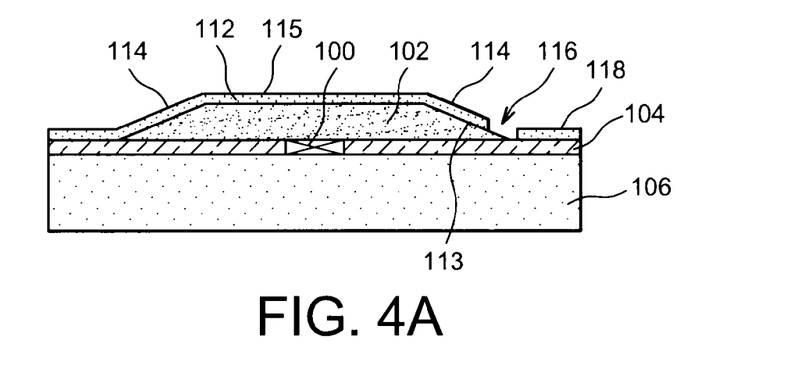

After this, one or more holes 116 are produced through the cover layer 112, forming entrance-ways to the sacrificial layer 102 (see FIG. 4A, in which a single hole 116 is represented).

These release holes 116 are then produced on the periphery of the sacrificial layer 102 in order to provide access to the lateral flanks 110 of the sacrificial layer 102. No releases hole are produced through an uppermost portion 115, or upper portion, of the cover layer 112.

In the example of FIG. 4A, the release holes 116 are produced in order to cross a portion of the lateral flanks 114 of the cover layer 112 and also of portions 118 of the cover layer 112 not covering the sacrificial layer 102, i.e. deposited on the active layer 104.

The section of each release hole 116, in a plane passing through one of the faces of the cover layer 112, is for example circular, ellipsoid, oblong or of any other shape the outline of which has no acute angle or break along its edges.

Figure 5A:
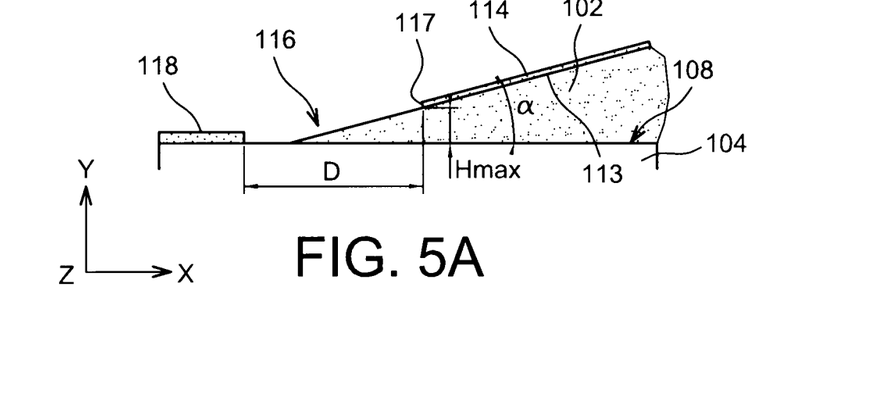

The release hole 116 produced in this manner is represented in detail in FIG. 5A.

A height Hmax is defined as the maximum height of the portion of the sacrificial layer 102 exposed in the release hole 116, and is a maximum distance, along an axis perpendicular to the face 108 of the active layer 104, between said face 108 and one of the edges 117 of the holes 116 at the level of a face 113 of the cover layer 112 positioned against the sacrificial layer 102.

The value of this height Hmax is determined according to the value of the angle α and the value of the dimension of the hole 116 along axis x (the axis parallel to the face 108 of the active layer 104 on which the sacrificial layer 102 is positioned), and more specifically of the dimension D, corresponding to the width (along axis x represented in FIG. 5A) of the etched portion of the lateral flank 114 from the point of junction between the lateral flank 114 and the portion 118 of the cover layer 112.

Several examples of values of the height Hmax obtained for an angle α=7° and for various types of release hole 116 are given below:

| Dimension D (μm) | Height Hmax (μm) |
| --- | --- |
| 2 | 0.24 |
| 3 | 0.36 |
| 6 | 0.72 |

Figure 4B:
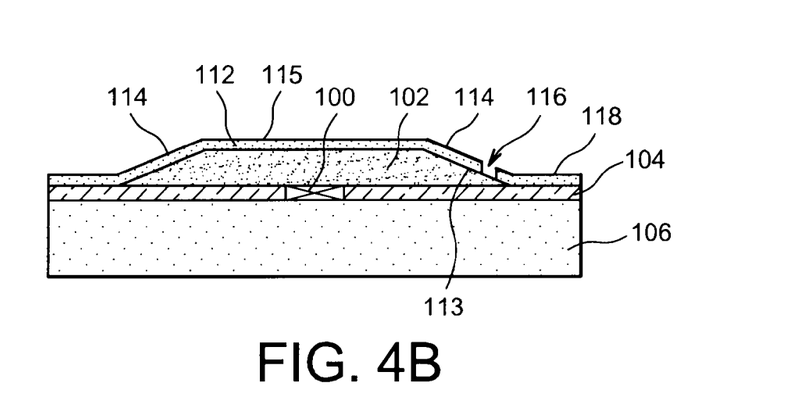

FIG. 4B represents a variant of release holes 116 (a single hole 116 is represented in FIG. 4B).

Figure 5B:
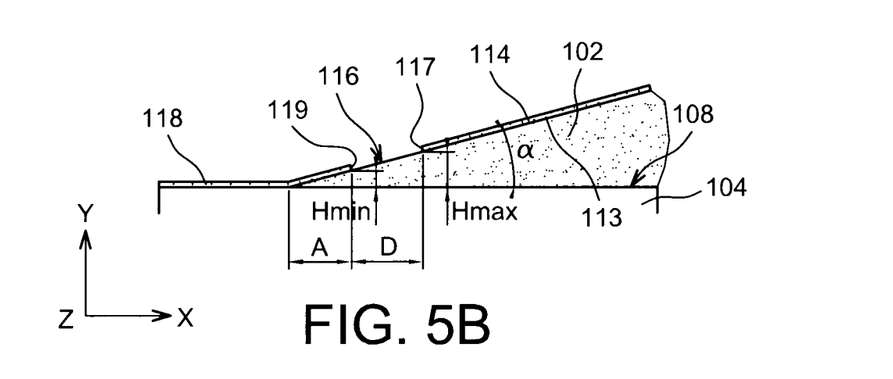

In this variant, the release holes 116 are produced only through the lateral flanks 114 of the cover layer 112, and not through the portions 118 of the cover layer 112 which do not cover the sacrificial layer 102. FIG. 5B represents in detail one of the release holes 116 produced according to this variant.

In a manner comparable with the example represented in FIG. 5A, the height Hmax corresponds to the maximum height of the portion of the sacrificial layer 102 exposed at the level of the release hole 116, i.e. at a maximum distance, along an axis perpendicular to the face 108 of the active layer 104, between said face 108 and one of the edges 117 of the holes 116 located on the side of the face 113 of the cover layer 112 positioned against the sacrificial layer 102.

In addition, given that the release hole 116 is produced only through one of the lateral flanks 114 of the cover layer 112, it is possible to define a height Hmin corresponding to the minimum height of the portion of the sacrificial layer 102 exposed at the level of the release hole 116 (by analogy, the height Hmin of the example of FIG. 5A is a zero height).

The values of these heights Hmax and Hmin are therefore determined according to the value of angle α, the value of the dimension D of the hole 116 along axis x (the axis parallel to the face 108 of the active layer 104 on which is positioned the sacrificial layer 102), which in this case is equal to the length (dimension along the axis x represented in FIG. 5A) of the etched portion of the lateral flank 114, and the distance A between the junction point of the lateral flank 114 with the portion 118 of the cover layer 112 and an outer edge 119 of the release hole 116.

Several examples of values of the heights Hmin and Hmax obtained for an angle α=7° with a distance A of between 0 and 1 μm, for various types of release hole 116, are given below:

| D (μm) | A (μm) | Hmin (μm) | Hmax (μm) |
|---|---|---|---|
| 2 | 1 | 0.12 | 0.24 |
| 3 | 0.5 | 0.06 | 0.42 |
| 4 | 0 | 0 | 0.48 |

Figure 5C:
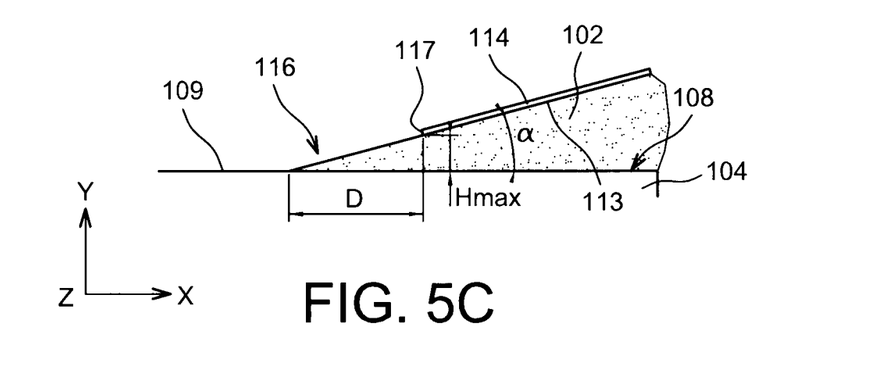

The example given on the last line of the above table matches hole 116 represented in FIG. 5C. This hole 116 is, in this case, tangential to a portion 109 of the face 108 which is not covered by the sacrificial material 102. In this example it can be seen that after the hole is produced no portion of the cover layer is located on this portion 109 (unlike the portion 118 represented in FIG. 5A), since the end of the lateral flank 114 which was lying on this portion 109 has been eliminated when the hole 116 was produced.

The values of the angle α and of a dimension D can be chosen such that the value of the height Hmax is less than approximately 3 μm, or between approximately 1 μm and 3 μm, or between approximately 0.1 μm and 1 μm, or again between approximately 2 μm and 3 μm.

The value of α can, for example, be between 45° and 90°, when the thickness of the sacrificial layer 102 is small, for example between approximately 0.5 μm and 1 μm. The variant embodiment represented in FIG. 4B can, notably, be implemented when it is desired to have a height Hmax of between approximately 1 μm and 2 μm.

Figure 4C:
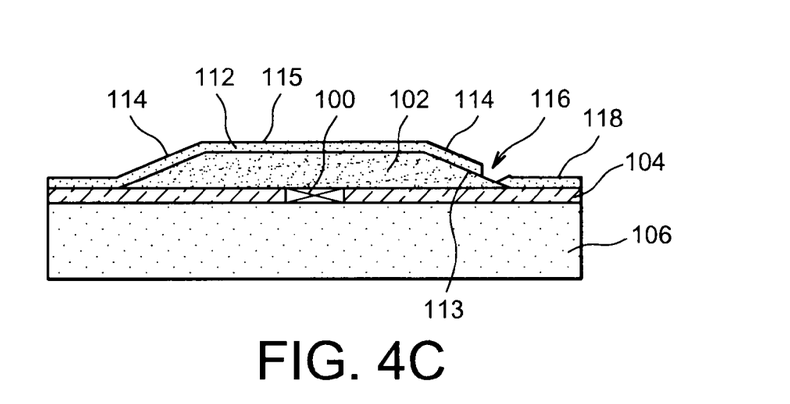

FIG. 4C represents a second variant embodiment of the release holes 116. In this second variant, the walls of the holes 116 at the level of the edges are not vertical (i.e. parallel to axis y, or perpendicular to the face 108 of the active layer 104), but inclined such that the dimensions of the sections of the holes 116 at the level of an outer face of the cover layer 112 are greater than the dimensions of the section of the holes 116 at the level of an inner face of the cover layer 122 which is in contact with the sacrificial layer 102, or on the side of the active layer 104. Thus, the orifices formed by the holes 116 at the level of the outer face of the cover layer 112 have a larger flow area than the orifices formed by the holes 116 at the level of the inner face of the cover layer 112.

Release holes 116 are therefore "funnel-shaped", which will subsequently facilitate the deposit of a plugging material in these holes 116.

This second variant embodiment of the holes 116 can also apply simultaneously for release holes produced solely through the lateral flanks 114, as in the example of FIG. 4B, or indeed to holes traversing the lateral flanks 114 and the portions 118 of the cover layer, as in the example of FIG. 4A and FIGS. 5A and 5C.

The release holes 116 will generally be produced such that there is sufficient distance between the release holes 116 of the microelectronic device 100 in order that the subsequent plugging of the holes does, not lead to deposits on the device 100.

Figure 6:
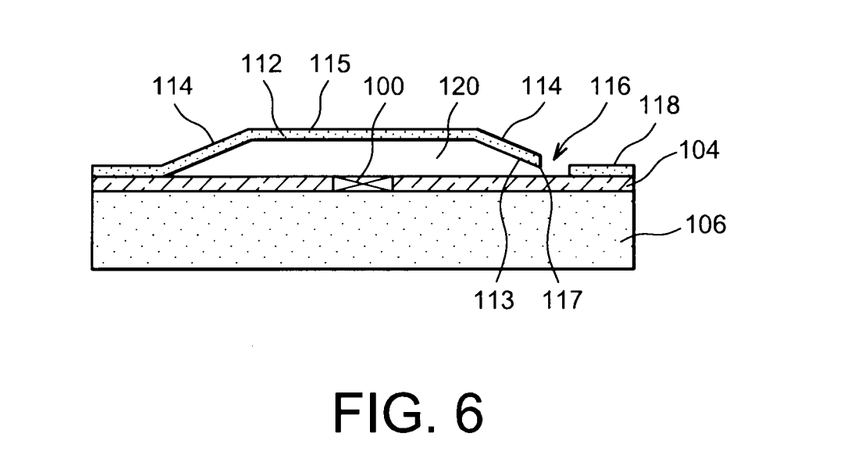

As represented in FIG. 6, the sacrificial layer 102 is then eliminated, for example by dry etching through the release holes 116.

The volume obtained by eliminating sacrificial layer 102 forms the cavity 120 in which the device 100 is encapsulated, and where the cover layer 112 forms, with the active layer 104, the walls of this cavity 120.

Figure 7:
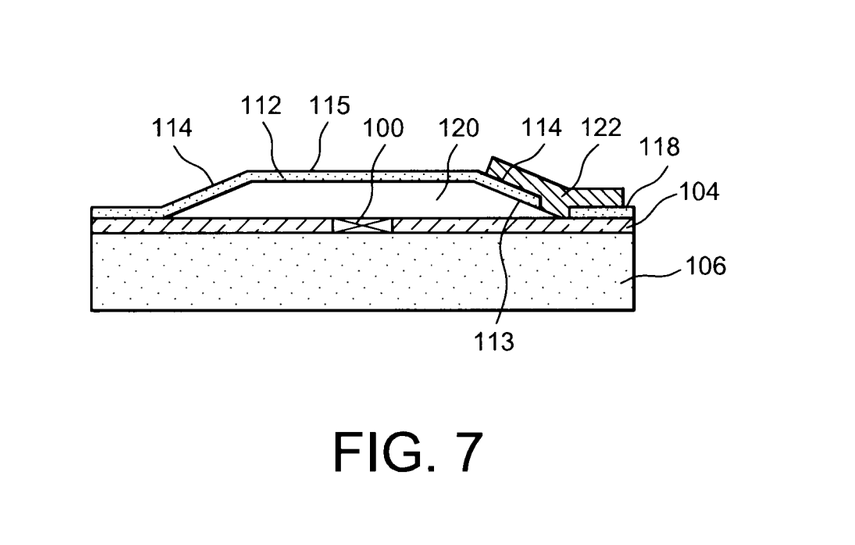

The release holes 116 are then plugged in order to close the cavity 120 hermetically (FIG. 7).

This plugging is accomplished, for example, by the deposit of a material 122 in the holes 116, where this material 122 may be a dielectric (for example $SiO_2$), a metal (for example titanium or aluminium), or a getter material, i.e. a material having properties of absorption and/or adsorption of gaseous molecules, such as for example chromium and/or titanium and/or zirconium and/or an alloy of these materials. The plugging material 122 is, for example, deposited under low pressure, i.e. at a pressure of between approximately 1 mbar and 900 mbar when it is deposited by PECVD (plasma-enhanced chemical vapour deposition) or PVD (physical vapour deposition), or under vacuum, for example at a pressure equal to approximately $10^{-7}$ mbar, when it is deposited, for example, by evaporation.

The technique of deposition of the plugging material 122 is chosen according to the atmosphere desired in the cavity 120 (low pressure or vacuum), which will be similar to the atmosphere in which the technique of deposition of the plugging material 122 is implemented.

Thus, bearing in mind that the release holes 116 have been produced on the periphery of the sacrificial layer 102, i.e. on the periphery of the cavity 120 in which the device 100 is encapsulated, there is therefore no risk that the plugging material may be deposited on the device 100, or may disrupt its operation.

When height Hmax is too great, for example greater than approximately 1 μm, in order to plug the release holes 116 by a method of evaporation under vacuum (for example when the maximum thickness which can be deposited by this technique does not enable the release holes 116 to be plugged completely), and/or if a closure under high vacuum of the cavity 120 is desired, the plugging of release holes 116 can be accomplished in at least two separate steps.

Figure 8:
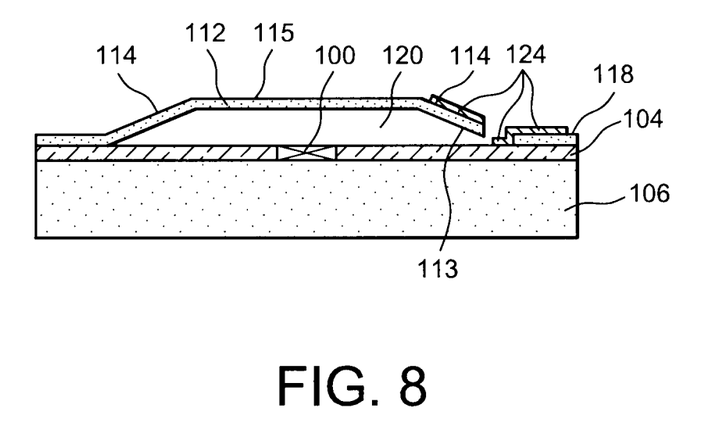

As represented in FIG. 8, the release holes 116 are firstly plugged partially by the deposit of a first plugging material 124, for example deposited by evaporation, PVD or PECVD.

Figure 9:
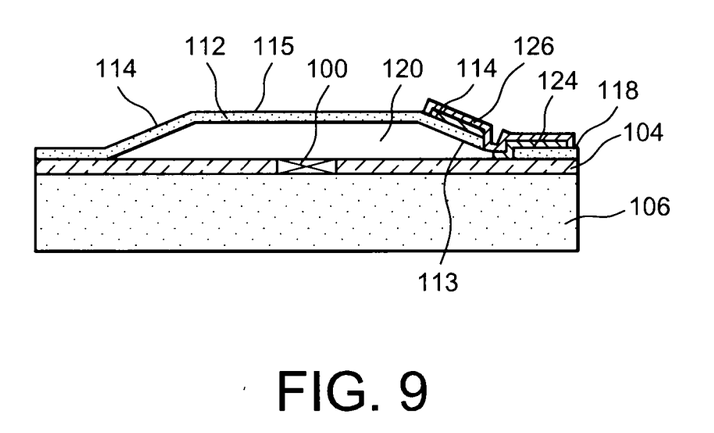

A second plugging material 126 can then be deposited, for example by evaporation under high vacuum, on the first plugging material 124, in order to close the cavity 120 hermetically (FIG. 9). Thus, the first plugging material 124 enables a portion of the release holes 116 to be filled.

The thickness of the second plugging material 126 required to accomplish the hermetic sealing of the cavity 120 is therefore less than the thickness which would be necessary to plug the holes 116 using a single plugging material as in FIG. 7.

In another variant, the first plugging material 124 could be a getter material and the second plugging material 126 could be a dielectric or metallic material, enabling the plug of the release holes 116 to be sealed.

In another variant embodiment, it is possible to produce several release holes 116 on the lateral flanks 114 of the cover layer 112, positioned at various distances from the edge of the cover formed by this layer 112, i.e. at various distances from the junction point between the lateral flanks 114 and the portion 118 of the cover layer 112.

In addition, as many release holes 116 as possibly are preferably produced in the cover layer 112 in order to reduce as far as possible the time required to eliminate the sacrificial layer 102.

Although this method of production of a sealed and hermetically closed cavity is particularly suitable for producing a cavity under low pressure or under vacuum, it is also possible to use this method to produce a hermetic cavity in which the pressure is equal to atmospheric pressure or to an ambient pressure.

In addition, although this method of production of a hermetic cavity was described above to produce an encapsulation of the microelectronic device 100, this method can also be used in all cases in which it is desired to produce a cavity and to plug it without depositing plugging material in uncontrolled fashion in the cavity.

This method could also apply to the production of a channel which would be formed by the produced cavity, plugging of which would not disrupt the passage of a liquid or gas passing through this channel.

The invention claimed is:

1. A method for production of at least one sealed cavity, comprising:
produce a sacrificial layer on a first portion of a face of a substrate;
producing a cover layer covering at least the sacrificial layer and a second portion of the face of the substrate not covered by the sacrificial layer and adjacent to the first portion of the face of the substrate covered by the sacrificial layer, the cover layer including lateral flanks forming, with the first portion of the face of the substrate covered by the sacrificial layer, at least an angle of less than 90°;
producing at least one hole through at least one of the lateral flanks of the cover layer such that all edges of the hole are delimited entirely by the cover layer, and such that a maximum distance, along an axis perpendicular to the face of the substrate, between the face of the substrate and at least an edge of the hole located on a side of a face of the cover layer positioned against the sacrificial layer, is less than approximately 3 μm, the hole crossing a portion of the cover layer positioned on the second portion of the face of the substrate which is not covered by the sacrificial layer;
eliminating the sacrificial layer through the hole so as to form the cavity; and
depositing at least one material plugging the hole thereby sealing the cavity.

2. The method according to claim 1, wherein an uppermost portion of the cover layer is kept without holes.

3. The method according to claim 1, wherein the angle formed by the lateral flanks of the cover layer with the first portion of the face of the substrate covered by the sacrificial layer is between approximately 5° and 30°.

4. The method according to claim 1, wherein a maximum thickness of the sacrificial layer is between approximately 0.5 μm and 1 μm and the angle formed by the lateral flanks of the cover layer with the first portion of the face of the substrate covered by the sacrificial layer is between approximately 45° and 90°.

5. The method according to claim 1, wherein the maximum distance, along the axis perpendicular to the face of the substrate, between the face of the substrate and the edge of the hole is between approximately 1 μm and 3 μm.

6. The method according to claim 1, wherein producing the cover layer includes implementing, after producing the sacrificial layer, a shaping of the sacrificial layer such that lateral flanks of the sacrificial layer form, with the portion of the face of the substrate covered by the sacrificial layer, the angle of less than 90°, followed by a conformal depositing of the cover layer at least on the sacrificial layer.

7. The method according to claim 1, wherein the hole includes, in a plane of the face of the cover layer positioned against the sacrificial layer, a section of dimensions less than a section of dimensions of a section of the hole in a plane of a second face of the cover layer opposite the face positioned against the sacrificial layer.

8. The method according to claim 1, wherein depositing the material plugging the hole in sealed fashion is implemented under a pressure of between approximately $1.10^{-3}$ mbar and 900 mbar or under vacuum.

9. The method according to claim 1, wherein depositing the at least one material plugging the hole includes
implementing a first depositing of at least a first material partially plugging the hole, and
a second depositing of at least a second material covering the first material at least partly, and sealingly plugging the hole.

10. The method according to claim 1, wherein the hole includes, in a plane of a face of the cover layer, a section of circular or oblong shape.

11. The method according to claim 1, wherein, prior to producing a sacrificial layer, a microelectronic device is produced on or in the first portion of the face of the substrate to be covered by the sacrificial layer, and
wherein the microelectronic device is sealingly encapsulated in the cavity after the depositing of the at least one material plugging the hole in thereby sealing the cavity.

12. The method according to claim 11, wherein the microelectronic device is of MEMS type.

13. The method according to claim 1, wherein the cavity forms a channel for passage of liquid or gaseous fluids.

14. An apparatus comprising:
a sealed cavity;
at least one cover layer positioned on a face of a substrate so as to form the cavity, the cover layer covering at least a second portion of the face of the substrate which is not positioned in the cavity and adjacent to a first portion of the face of the substrate positioned in the cavity, the cover layer including lateral flanks forming, with the first portion of the face of the substrate positioned in the cavity, at least an angle of less than 90°; and at least one hole disposed through at least one of the lateral flanks of the cover layer such that all edges of the hole are delimited entirely by the cover layer and such that a maximum distance, along an axis perpendicular to the face of the substrate, between the face of the substrate and at least one edge of the hole located on a side of a face of the cover layer forming a wall of the cavity, is less than approximately 3 µm, wherein the hole crosses a portion of the cover layer deposited on the second portion of the face of the substrate which is not positioned in the cavity, and wherein at least one material plugs the hole thereby sealing the cavity.

15. The cavity according to claim 14, wherein an uppermost portion of the cover layer does not have a hole therethrough.

16. The cavity according to claim 14, wherein the angle formed by the lateral flanks of the cover layer with the first portion of the face of the substrate positioned in the cavity is between approximately 5° and 30°.

17. The cavity according to claim 15, wherein a distance between the uppermost portion of the cover layer and the substrate is between approximately 0.5 µm and 1 µm, and wherein the angle formed by the lateral flanks of the cover layer with the first portion of the face of the substrate positioned in the cavity is between approximately 45° and 90°.

18. The cavity according to claim 14, wherein at least one microelectronic device is sealingly encapsulated in the cavity.

19. The cavity according to claim 14, where the cavity forms a channel for passage of liquid or gaseous fluids.

* * * * *